(12) United States Patent
Negishi et al.

(10) Patent No.: US 6,645,870 B2
(45) Date of Patent: Nov. 11, 2003

(54) PROCESS FOR FABRICATING SEMICONDUCTOR DEVICE

(75) Inventors: Nobuyuki Negishi, Kokubunji (JP); Masaru Izawa, Hino (JP)

(73) Assignee: Hitachi, Ltd., Tokyo (JP)

(*) Notice: Subject to any disclaimer, the term of this patent is extended or adjusted under 35 U.S.C. 154(b) by 5 days.

(21) Appl. No.: 09/928,500

(22) Filed: Aug. 14, 2001

(65) Prior Publication Data

US 2003/0013313 A1 Jan. 16, 2003

(30) Foreign Application Priority Data

Jul. 11, 2001 (JP) ........................................ 2001-210149

(51) Int. Cl.[7] .............................................. H01L 21/00
(52) U.S. Cl. ........................ 438/710; 438/700; 438/706; 438/719; 438/723; 438/724
(58) Field of Search ................................ 438/706, 710, 438/719, 723, 724, 700

(56) References Cited

U.S. PATENT DOCUMENTS

| | | | |
|---|---|---|---|
| 5,292,393 A | 3/1994 | Maydan et al. | 156/345 |
| 6,036,878 A | * 3/2000 | Collins | 216/68 |

FOREIGN PATENT DOCUMENTS

| | | |
|---|---|---|
| JP | 4-286115 | 10/1992 |
| JP | 11-145282 | 5/1999 |
| JP | 11-251294 | 9/1999 |

OTHER PUBLICATIONS

N. Negishi et al, "High Aspect–Ratio Contact hole etchinh in UHF–ECR plasma" 2000 Dry Process Sumposium, pp. 31–36.*

N. Negishi et al, "High–Aspect–Ratio Contact hole etching in UHF–ECR plasma" 2000 Dry Process Symposium, pp. 31–36.

* cited by examiner

Primary Examiner—Felisa Hiteshew
(74) Attorney, Agent, or Firm—Mattingly, Stanger & Malur, P.C.

(57) ABSTRACT

Disclosed is a process for fabricating a semiconductor device, which efficiently suppresses a damage layer formed on a base silicon substrate or an interconnection layer and removes a high resistivity layer in the formation of a contact hole, thereby reducing a contact resistance. The contact hole is formed in an etching step of reducing ion energy and an oxygen flow rate as an etching depth progresses, thereby suppressing the damage layer formed on the base. The reduction of the contact resistance is achieved by using a step of removing the high resistivity layer using hydrogen or a hydrogen-containing gas plasma.

14 Claims, 11 Drawing Sheets

PROCESS FOR FABRICATING SEMICONDUCTOR DEVICE

BACKGROUND OF THE INVENTION

1. Field of the Invention

The present invention relates to a fabrication technology for semiconductor devices, and, more particularly, to a dry etching technique for an interlayer insulating film in a process for fabricating a semiconductor device.

2. Description of the Prior Art

In a process for fabricating a semiconductor device, such as VLSI or ULSI, to electrically interconnect transistors formed on the major surface of a semiconductor wafer (hereinafter simply called "wafer") and metal interconnection lines, minute contact holes are formed in an interlayer insulating film (thin film essentially consisting of silicon oxide; hereinafter called "oxide film") formed on an upper portion of the transistor structure and between the interconnection lines by a dry etching technique using a plasma, and a semiconductor or metal is filled in the contact holes. Then, the transistors are electrically interconnected, and so are the metal interconnection lines both via the semiconductor or metal.

Dry etching is a technique which selectively etches a target film (interlayer insulating film) by transforming an etching gas fed into a vacuum chamber into a plasma with high frequency power externally applied and accurately reacting reactive radicals or ions produced in the plasma on the wafer.

As the miniaturization of semiconductor devices and the speed improvement progress, it becomes important to reduce the contact resistance between the base semiconductor layer in the contact hole formed by dry etching or the base interconnection lines and the metal filled in the contact hole.

The following are known techniques of reducing the contact resistance in a contact hole (through hole) formed by dry etching or preventing wiring corrosion at the bottom of a contact hole.

(1) Japanese Patent Laid-Open No. 286115/1992 (prior art 1):

The prior art 1 discloses a technique of eliminating a foreign matter from a contact hole and reducing the contact resistance by placing a semiconductor device in an atmosphere containing heated hydrogen, an atmosphere containing a hydrogen plasma or an atmosphere containing a hydrogen plasma and chlorine plasma after etching, thereby removing a deposit from the contact hole.

(2) Japanese Patent Laid-Open No. 251294/1999 (prior art 2):

The prior art 2 discloses a technique of forming a low-resistance contact on the premise that the base contains a metal silicide. According to the prior art 2, when a photoresist mask after formation of a contact hole is eliminated by ashing, a nitrogen-based active species is used to prevent oxidation of the metal silicide.

(3) Japanese Patent Laid-Open No. 145282/1999 (prior art 3):

The prior art 3 discloses a technique of removing a deposition film containing a metal, such as Al, sticking on the sidewall of a through hole without causing corrosion of the Al wiring or the like at the bottom of the through hole. According to the prior art 3, after a deposit in the through hole is removed by the $BCl_3$ which is a reducing gas, resist ashing is carried out with a plasma containing H and O.

The fabrication of semiconductor devices, such as VLSI and ULSI, requires the improvement of the throughput. A multichamber processing system mentioned below is known as fabrication equipment to improve the throughput.

(4) The specification of U.S. Pat. No. 5,292,393 (prior art 4):

The prior art 4 discloses a multichamber processing system which comprises etch, deposition, sputtering and RTA (Rapid Thermal Annealing) chambers.

In fabricating a ULSI device based on design rules after the 0.1-$\mu$m scale, the following points should be satisfied more.

(1) To set the aspect ratio (depth of contact hole/diameter of contact hole) to 15 or greater.

(2) To carry out high selectivity contact-hole etching with a bowing-free etched shape.

(3) To reduce the contact resistance in a contact hole.

"Bowing" is disclosed in Negishi et al., "High-Aspect-Ratio Contact hole etching in UHF-ECR plasma", pp 31–36, 2000 Dry Process Symposium.

SUMMARY OF THE INVENTION

To fulfill the requirements, the present inventors studied techniques of reducing the contact resistance in a contact hole. The following discusses the reviews.

Contact holes were processed using a UHF-ECR plasma etching system. For example, an interlayer insulating film was selectively etched by feeding a fluorocarbon gas, such as $CF_4$, $CHF_3$, $C_2F_6$, $C_3F_6O$, $C_4F_8$, $C_5F_8$ or $C_4F_6$, into a vacuum chamber, forming a plasma in a pressure range of 0.5 Pa to 10 Pa and accelerating the ion energy incident to a wafer from 0.5 kV to 2.5 kV.

To form contact holes with a high aspect ratio, it is necessary to suppress etch stop and improve the etching rate that affects the throughput. Therefore, etching was carried out while keeping the ion energy relatively high from the beginning of etching to the end thereof.

There is an issue of nonuniformity of etching rate over the wafer surface. It is necessary to prevent some of contact holes from being unformed in the wafer surface due to the nonuniform etching rate. To meet the requirement, overetching was performed with the etching time being about 120 to 130% with respect to the depth of contact holes. The "nonuniformity of etching rate" means a difference in etching rate between the center portion of the wafer and the peripheral portion thereof.

Overetching causes the surfaces of active regions or interconnection layers at the bottoms of some of the contact holes to be exposed to ion bombardment with high ion energy for about 20% to 30% more than the adequate etching time. That is, the ion bombardment may damage the active region or its surface. Specifically, the active region is the source-drain region of an MOS transistor which is formed in a single-crystalline silicon substrate to serve as an MOS element.

Further, dissociation of the fluorocarbon gas causes C radicals or O radicals generated in the plasma to be implanted in the active region by the incident ions. As a result, a high resistivity layer containing SiC or $SiO_x$ is formed several nanometers deep in the active region. This high resistivity layer is a factor which increases the contact resistance. The increased contact resistance hinders the improvement of the speeds of semiconductor devices such as ULSI.

One way to suppress an increase in contact resistance originated from the high resistivity layer is to generate a plasma with a gas mixture of a gas having a large fluoride content, such as $CF_4$, and an Ar gas or $O_2$ gas after formation of a contact hole and remove the high resistivity layer with relatively low ion energy of 500 V or below.

As the gas contain a large amount of C (carbon) or O (oxygen), however, the high resistivity layer would remain on the surface in the contact hole. This requires that the high resistivity layer be removed by wet processing using a solution which contain a hydrofluoric solution.

Because isotropic etching progresses in the wet processing, the insulating film on the sidewall of the contact hole is also etched out. This brings about a new problem that the finished sizes would become wider than the designed sizes. In the fabrication process for DRAMs (Dynamic Random Access Memories) of 1 Gbits or larger, particularly, this problem becomes one of factors that hinder the miniaturization.

Accordingly, it is an object of the invention to provide a process for fabricating semiconductor devices which achieves large scale integration and improves the speed of the semiconductor devices.

It is another object of the invention to improve the throughput in the fabrication of semiconductor devices.

The above and other objects of the invention and the features thereof will be readily apparent from the following detailed description, taken in conjunction with the accompanying drawings.

DETAILED DESCRIPTION OF THE PREFERRED EMBODIMENTS

The following briefly discusses a typified one of the subject matters disclosed in this application.

A process for fabricating a semiconductor device according to the invention comprises the steps of:

forming an interlayer insulating film on a substrate having a semiconductor layer or a conductor layer on a major surface;

forming on the interlayer insulating film a mask having an opening located above the semiconductor layer or the conductor layer;

selectively etching the interlayer insulating film through the opening of the mask in an environment in which a gas containing a fluorocarbon gas and oxygen gas is excited in a plasma state, thereby forming an opening in the interlayer insulating film through which a surface of the semiconductor layer or the conductor layer is exposed;

processing the surface of the semiconductor layer or the conductor layer exposed through the opening of the interlayer insulating film by applying the substrate with a bias for accelerating ions in an environment of a reducing gas being excited in a plasma state in that environment; and burying a semiconductor or conductor in the opening of the interlayer insulating film.

According to the invention, as the surface of the semiconductor layer or the conductor layer exposed by plasma etching is processed in the environment where a reducing gas (e.g., a hydrogen-containing gas) is excited in a plasma state, a carbon compound or oxygen compound (e.g., a high resistivity layer containing SiC or $SiO_x$ in the case of a silicon layer) present on the surface of the semiconductor layer or conductor layer is removed. That is, as energy is applied to the compound on the surface of the substrate, which has been firmly bonded by the ion bombardment, by the bias applied to the substrate, carbon (C) or oxygen (O) is easily dissociated and is reacted with radicals, thereby removing the high resistivity layer on the surface. This can suppress an increase in contact resistance in the minute opening (contact hole or through hole) in the interlayer insulating film. In other words, large scale integration of a semiconductor device and improvement of the speed thereof can be achieved.

Preferred embodiments of the invention are described below in detail with reference to the accompanying drawings. To avoid the redundant description, like or same reference symbols are given, in the diagrams for explaining the embodiments, to those corresponding components of the embodiments which have the same functions.

(First Embodiment)

Figure 1:
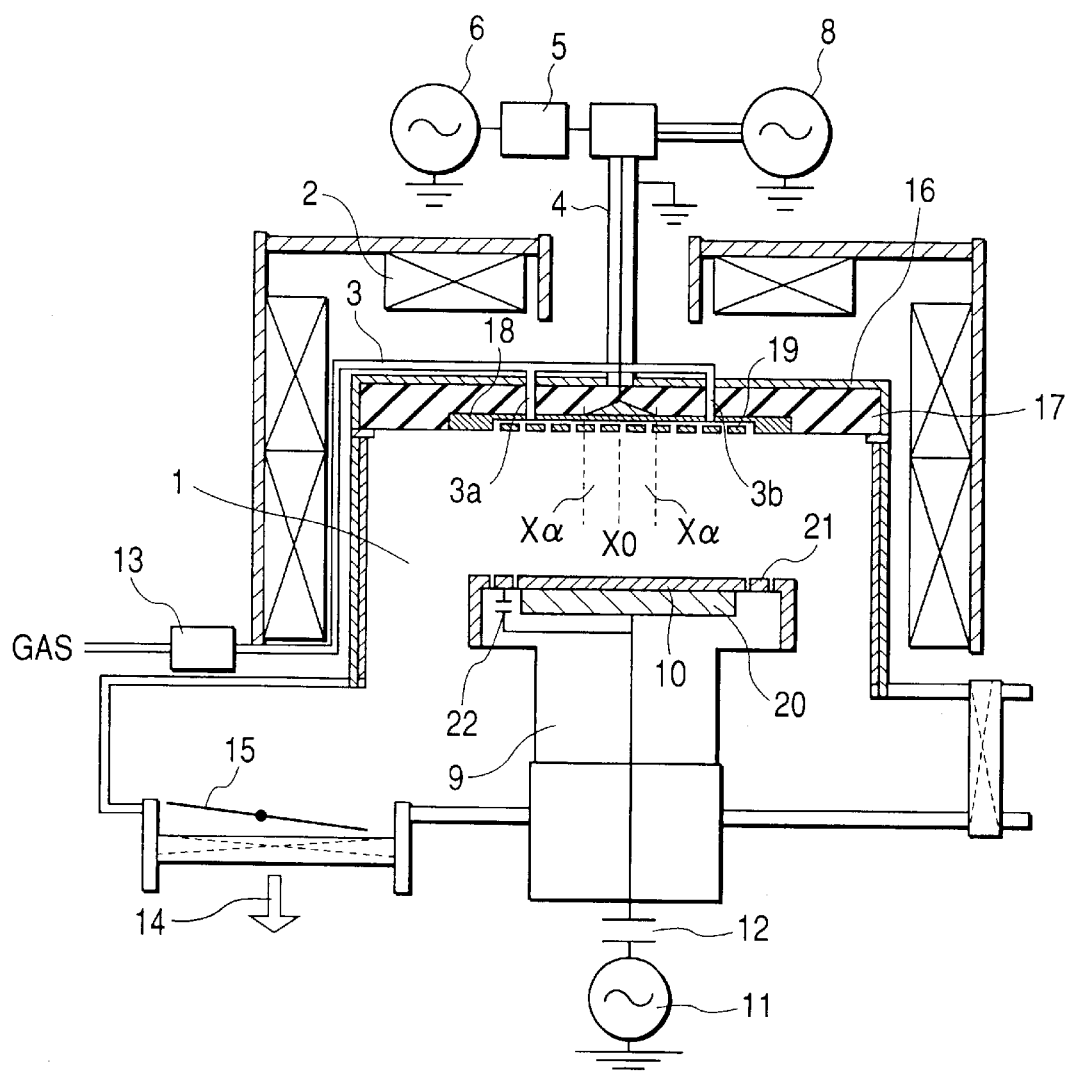
FIG. 1 is a schematic diagram of a dry etching apparatus for use in the invention.

FIG. 1 presents a schematic diagram of a UHF-ECR (Electron Cyclotron Resonance) plasma etching apparatus for use in the invention.

To begin with, the general structure of the etching apparatus is described briefly. In the embodiment, a solenoid coil 2 is placed around a vacuum chamber 1. A source gas is fed into the vacuum chamber 1 via a gas flowmeter 13, a gas supply pipe 3 and gas inlet ports 3a and 3b. An electromagnetic wave generated by a UHF power supply (450 MHz) 6 is supplied via a co-axial cable 4 and a matching box 5 to an antenna for irradiating the electromagnetic wave (hereinafter simply referred to as "antenna"). The interaction of a magnetic field generated by the solenoid coil 2 with the electromagnetic wave produces a plasma in the vacuum chamber 1. The antenna is provided with an RF bias power supply (13.56 MHz) 8, which can change an applied bias depending on the process.

Provided in the vacuum chamber 1 is a bottom electrode 9 on which a semiconductor substrate (semiconductor wafer) 10 as a specimen to be treated is mounted. The bottom electrode 9 is connected with a high frequency bias power supply (800 KHz) 11 via a blocking condenser 12. A peak-to-peak voltage Vpp which is generated by the high frequency bias power supply 11 is approximately 0.5 kV to 2 kV. This voltage Vpp causes ions in the plasma to be injected into the semiconductor substrate and the ion bombardment accelerates isotropic etching of an interlayer insulating film (oxide film) formed in the surface of the semiconductor substrate.

In the embodiment, the source gas is used as a mixed gas, such as $C_5F_8$ or Ar. The pressure in the vacuum chamber 1 is controlled to be 5 to 40 mTorr by a conductance valve 15 provided between a vacuum pump system 14 and the vacuum chamber 1.

Next, means for supplying an electromagnetic wave (hereinafter referred to as "electromagnetic-wave supplying means") is specifically discussed below. The electromagnetic wave of 450 MHz generated by the UHF power supply 6 is supplied via the co-axial cable 4 to a disk-shaped conduction plate 18 which is mounted on an earth potential conduction plate 16 via a dielectric 17. The excitation mode is formed at the interface between the disk-shaped conduction plate 18 and the dielectric 17 by setting the diameter of the disk-shaped conduction plate 18 to a predetermined size. The embodiment uses a disk-shaped conduction plate of approximately 35 cm in diameter which can excite in the TM01 mode. With the microstrip antenna structure that uses the earth potential conduction plate, dielectric and conduction plate, the impedance from the power feeding point varies depending on the position of the power feeding point. The value of the impedance generally varies from 0 to about 300 Ω from the center to the end of the conduction plate. To provide impedance matching, supply an electromagnetic wave to the back of the conduction plate with a high efficiency and keep the generation of the plasma, power is supplied in the form of a concentric circle from an eccentric point Xα, avoiding a center X0 of the conduction plate as shown in FIG. 1, so that high axis symmetry and high efficiency of irradiation are achieved. Though not illustrated, the electromagnetic wave from the co-axial cable 4 may be separated into two waves one of which is made to travel through a cable longer by a ¼ wavelength than the cable for the other so that the two waves are supplied to two points on the disk-shaped conduction plate 18. Shifting the transmission path of the electromagnetic wave by a ¼ wavelength can shift the phase by 90 degrees. A circular polarized wave can be excited by combining rotary electric fields on the disk-shaped conduction plate 18. This improves the axis symmetry of the irradiated electric field and the efficiency of absorption of electrons of an electromagnetic wave into kinetic energy caused by the electron cyclotron resonance.

The supply of the source gas is discussed below. The source gas is fed from the back of the earth potential conduction plate 16 via the gas supply pipe 3. In the case of excitation in the TM01 mode, the node of an electric field lies on the circumference at a position shifted from the center X0. Therefore, the gas inlet ports 3a and 3b are provided at the positions that minimize the field intensity as shown in FIG. 1. As the gas is fed through the gas inlet ports 3a and 3b, local discharge can be prevented. The disk-shaped conduction plate 18 is provided with space so that the gas is uniformly dispersed through at least 10 minute holes formed in the surface of the conduction plate 18.

A silicon disk plate 19 having at least 10 minute holes formed in the surface thereof is secured to the surface of the disk-shaped conduction plate 18. The silicon disk plate 19 is so designed as to be able to consume fluorine radicals that are generated in the plasma and reduce the selectivity of a photo-resist, a poly-crystalline silicon, or a silicon nitride film to a silicon oxide film. A coolant whose temperature is adjusted to an adequate level can be supplied to the disk-shaped conduction plate 18 via a coolant supply pipe (not shown). Accordingly, the temperature of the surface of the silicon disk plate 19 can be controlled to a desired level.

A chuck section (wafer holding mechanism) 20 for holding a wafer as a specimen to be treated is provided at the center portion of the bottom electrode 9 that serves a wafer table (means for holding a specimen to be treated). The chuck section 20 uses, for example, an electro-static chuck as the chuck mechanism. Though not specifically illustrated, the surface side of the electro-static chuck that holds the wafer has a thin conductor film, such as a thin copper film, sandwiched between two thin ceramic films of, for example, aluminum nitride. A wiring for supplying a voltage is connected to a DC voltage source via a low-pass filter which is formed from a coil or the like.

The wafer holding mechanism may be a mechanical chuck which mechanically clamps the wafer with a clamp member. The electro-static chuck has an unillustrated heat transfer gas supply hole so that the thermal conduction efficiency from the bottom electrode 9 to the wafer can be improved by, for example, a helium gas supplied through that hole.

A ring-like member 21 (hereinafter called "focus ring") is located at the peripheral portion of the bottom electrode 9. The focus ring 21, which is made of a conductor or an insulator, has capabilities of adjusting the application of the high frequency bias power and the surface temperature to ensure uniform distribution of radicals in the plasma. That is, the focus ring 21 ensures uniform radical distribution at the center and peripheral portions of the wafer.

The high frequency bias power to be applied to the electro-static chuck of the bottom electrode 9 is divided by a condenser 22 and is supplied to the focus ring 21. In this case, the power dividing ratio is determined by a ratio of the sheath capacitance at the front face of the wafer to the capacitance of the condenser. To change the high frequency bias power to be applied to the focus ring 21, therefore, the condenser 22 should be variable. A similar effect is acquired if the high frequency bias power is applied to the focus ring 21 via an unillustrated impedance matching box. The focus ring 21 may be provided through a dielectric ring of aluminum oxide or the like provided at the peripheral portion of an electrode which has the same potential as the bottom electrode 9. In this case, the dielectric is equivalent to the condenser 22 and changing the thickness of the dielectric can alter the capacitance, thereby changing the high frequency bias power to be applied to the focus ring 21.

Figure 2A:
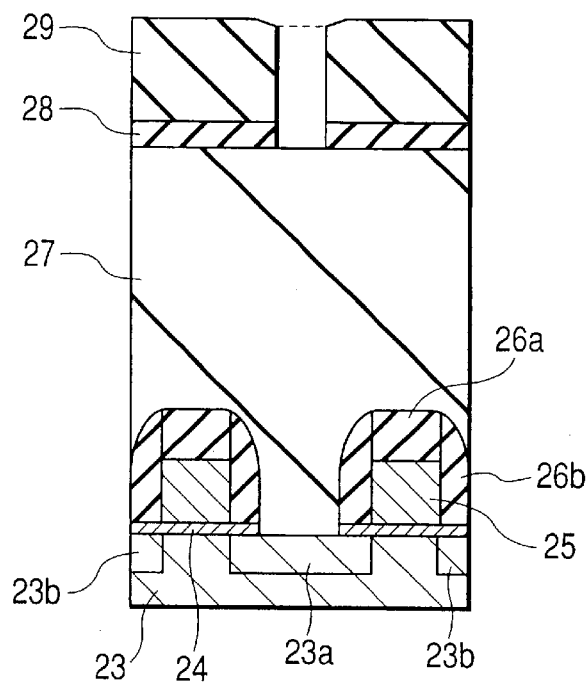
FIGS. 2A and 2B are cross-sectional views of essential portions in the fabrication of a semiconductor device according to a first embodiment of the invention.
Figure 2B:
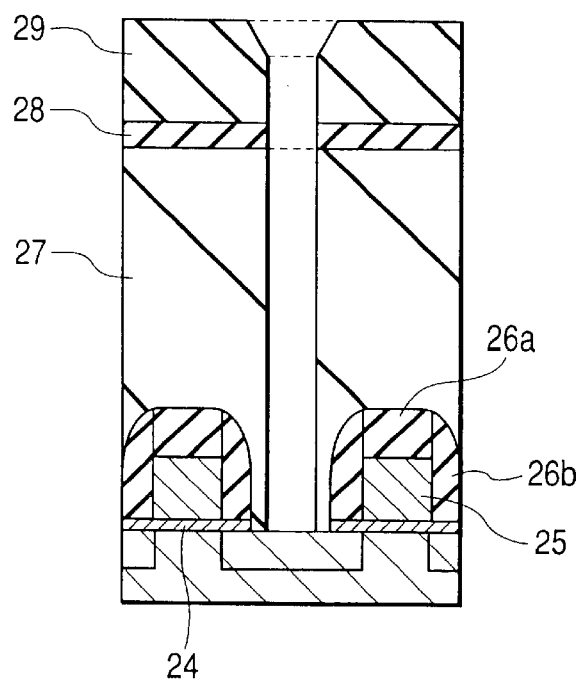

Referring now to FIGS. 2A and 2B, a description is given of the procedures of the fabrication of a semiconductor device using the plasma etching apparatus shown in FIG. 1.

A semiconductor substrate (silicon wafer of 8 inches in diameter) of single-crystalline silicon is loaded into a vacuum processing chamber of the etching apparatus as a specimen to be treated. FIG. 2A presents a cross-sectional view of essential portions of the major surface of the silicon wafer in the phase of forming an opening (contact hole) in an interlayer insulating film.

In FIG. 2A, a source-drain region 23a, 23b is formed in a semiconductor substrate 23 at a depth of 70 nm or less. A gate oxide film 24 having a thickness of, for example, 2 nm, is formed on the major surface of the semiconductor substrate 23. Formed on the gate oxide film 24 is a gate electrode 25 which is the lamination of poly-crystalline silicon and tungsten and has a thickness of 200 nm and a width of 100 nm. A cap layer 26a is formed on the top of the gate electrode 25, and sidewall layers 26b are formed on both sides of the gate electrode 25. The cap layer 26a and sidewall layers 26b are both-formed from a silicon nitride film. Even if mask misalignment occurs at the time of exposure, therefore, exposure of the gate electrode 25 is avoided by selecting the etching conditions that have a high selectivity of the silicon nitride film to the oxide film (interlayer insulating film). This can avoid electric short-circuiting between the gate electrode 25 and a conductor layer buried in a through hole in the oxide film. An oxide film ($SiO_2$) 27 of 2000 nm in thickness is formed as an interlayer insulating film on the gate oxide film 24. Formed on the top portion of the oxide film 27 are an anti-reflect-coating 28 having a thickness of 80 nm and a resist mask 29 having a thickness of 500 nm. A hole pattern of 120 nm in diameter is formed on the resist mask 29 by exposure. The anti-reflect-coating 28 has already been selectively etched in association with the hole pattern of the resist mask 29 in the vacuum chamber 1 of the etching apparatus shown in FIG. 1 by a mixed gas of $N_2$ and $CF_4$.

Next, with the resist mask 29 used as a mask, the oxide film 27 is etched as shown in FIG. 2B.

Ar, $C_5F_8$ and $O_2$ are fed into the vacuum chamber 1 of the etching apparatus shown in FIG. 1 at rates of, for example, 500 ml/min, 15 ml/min and 18 ml/min, respectively. The pressure in the vacuum chamber 1 is adjusted by the conductance valve in such a way that the pressure becomes 15 mTorr. A plasma is produced with 450-MHz high frequency power of 400 W and 800-kHz high frequency power of 2000 W (2.83 W/cm$^2$) is applied to the bottom electrode 9 to etch the oxide film 27. In this case, the intended ion energy Vpp is about 1.8 kV. The height of the bottom electrode 9 is adjusted in such a way that the distance from the wafer surface to the antenna surface facing the wafer becomes 30 mm, and 13.56-MHz high frequency power of 600 W is applied to the antenna.

Figure 5A:
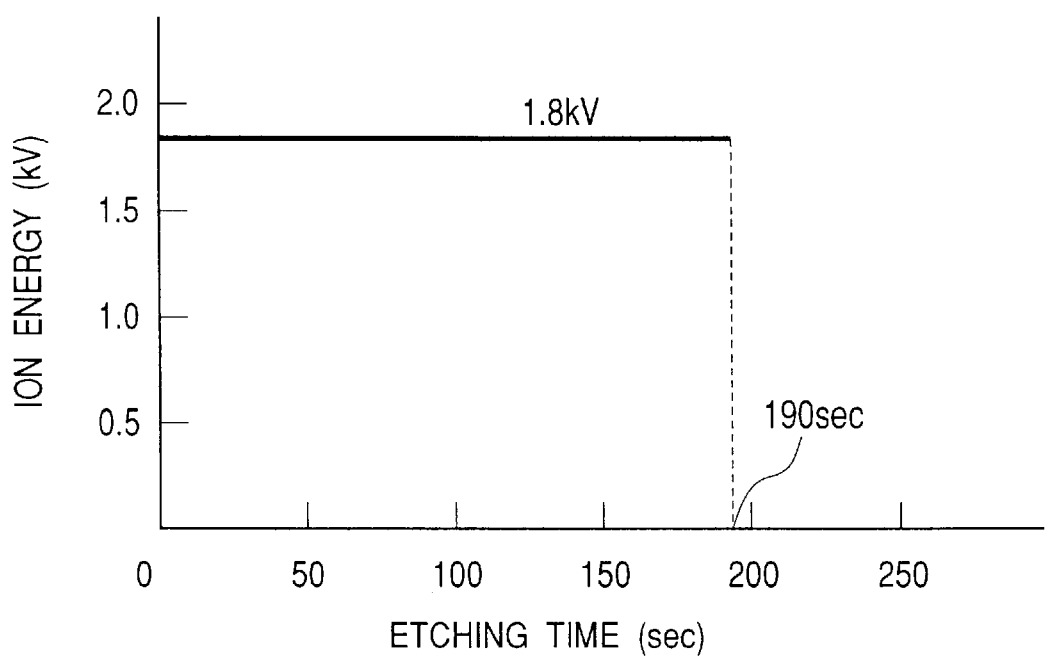
FIGS. 5A and 5B are characteristic diagrams respectively showing the relationships between ion energy Vpp and etching time in a case of etching without ion energy control and in a case of etching according to the invention which uses ion energy control.

Under those process conditions, as the etching rate for a hole of 120 nm in diameter is about 700 nm/min, a through hole reaches to the source-drain region (active region) in approximately 170 seconds (S1), thereby exposing the surface of the active region. To ensure the opening of every through hole over the entire wafer surface in consideration of a difference in etching rate on the wafer surface, however, the etching time was set to 190 seconds (S2) as shown in FIG. 5A. The cross section then is illustrated in FIG. 2B. FIGS. 3A through 3D are detailed cross-sectional views of the cross section. In FIGS. 3A to 3D, the gate oxide film and the gate electrode shown in FIGS. 2A and 2B are omitted.

Figure 3A:
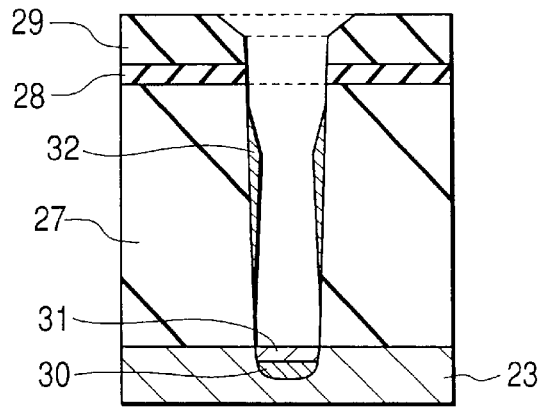
FIGS. 3A through 3D are cross-sectional views of essential portions in the fabrication of a semiconductor device that the present inventors studied before the first embodiment of the invention.

Depending on the position in the wafer surface, the active region (source-drain region) is bombarded with high ion energy of about 1.8 kV for about 20 seconds (S2–S1) which is a time for etching to end since etching has reached the base active region. Accordingly, a damage layer 30 which has crystal defects is formed about 50 nm thick in the active region as shown in FIG. 3A. A high resistivity layer 31 containing SiC and $SiO_x$ is formed several nanometers on the surface of the active region (the upper portion of the damage layer 30). Further, a fluorocarbon film 32 is formed on the inner surface of each hole. It is thought that the high resistivity layer 31 is formed by the following mechanism.

C radicals or O radicals in the plasma are implanted into the active region (single-crystalline silicon) by the ions having energy, or carbon (C) or oxygen (O) itself becomes $C^+$ or $O^+$ ions which are implanted into the active region. As carbon (C) or oxygen (O) is bonded to silicon, the high resistivity layer 31 is formed.

According to the embodiment, in view of the above, first a contact hole is formed by the following etching scheme in order to reduce the high resistivity layer 31.

Figure 5B:
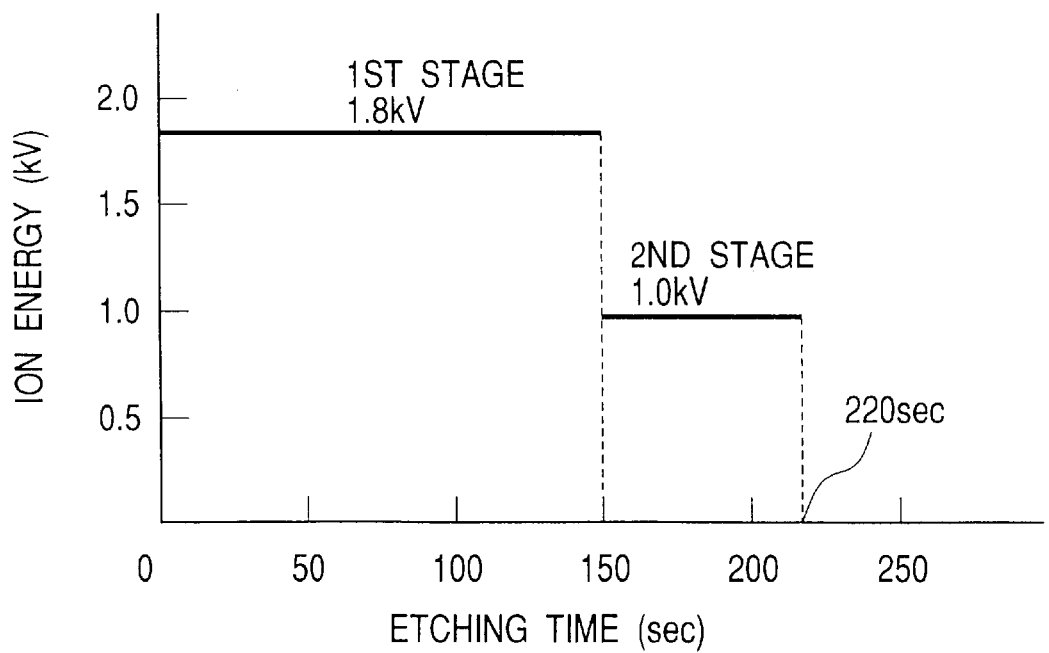

As shown in FIG. 5B the 800-kHz high frequency power that is applied to the bottom electrode 9 is set to 2000 W (2.83 W/cm$^2$) at the beginning of contact hole etching (1st stage). After etching proceeds 150 seconds (2nd stage), the power is switched 850 W 1.20 W/cm$^2$). When etching is carried out under this condition, the intended ion energy Vpp is about 1.8 kV for 150 seconds since the beginning of etching but the ion energy drops toe about 1.0 kV after 150 seconds. The etching rate of the through hole with high frequency power of 850 W drops to about 400 nm/mm. To ensure a constant amount of overetching, the total etching time is set to 220 seconds. Accordingly, the silicon surface of the active region is bombarded with relatively low ion energy Vpp of approximately 1.0 kV for about 30 seconds since the base silicon surface was exposed.

Figure 4A:
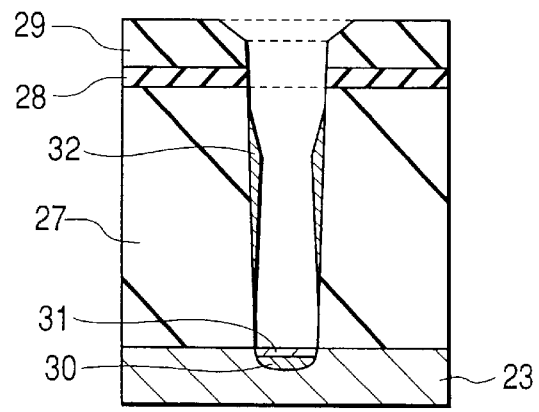
FIGS. 4A through 4D are cross-sectional views of essential portions in the fabrication of a semiconductor device according to the first embodiment of the invention.

As shown in FIG. 4A, therefore, the damage layer 30 (depth) is made shallower than one shown in FIG. 3A. As the amount of C or O implanted into the high resistivity layer 31 formed on the upper portion of the damage layer 30 is also reduced, the high resistivity layer 31 can be made shallower as shown in FIG. 4A. The gate oxide film and the gate electrode shown in FIGS. 2A and 2B are also omitted in FIGS. 4A to 4D.

The same effect is acquired by setting the 800-kHz high frequency power that is applied to the bottom electrode 9 in the initial stage (1st stage) of etching shown in FIG. 5B in a range of 1000 W (1.42 W/cm$^2$) to 3000 W (4.25 W/cm$^2$) and reducing the power to ½ or lower at the time of power switching (2nd stage).

The ion energy control in association with the aspect ratio is considered to reduce the damage layer 30.

Figure 6:
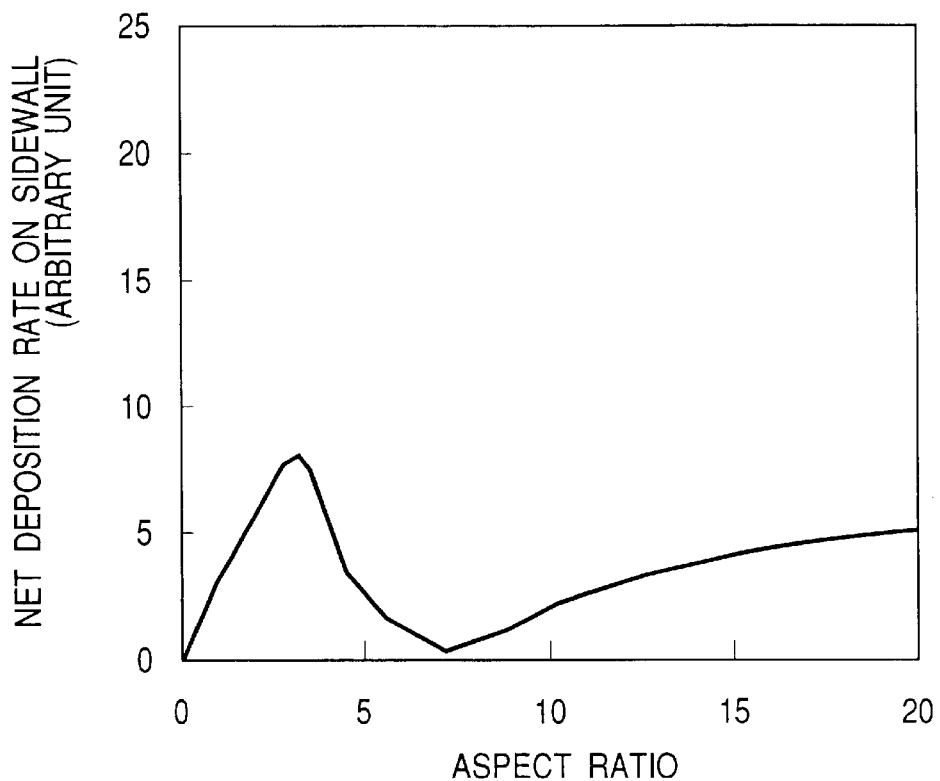
FIG. 6 is a characteristic diagram showing a dependency of the net deposition rate on the sidewall of a hole on the aspect ratio of the hole according to a second embodiment of the invention.

FIG. 6 is a conceptual diagram showing the relationship between the net deposition rate on sidewall and the aspect ratio as etching is in progress. The net deposition rate on sidewall is the amount of etching of the deposition film by F or O subtracted from the amount of deposition radicals C or $CF_2$. While the deposition rate is low at the upper portion of the hole because of a large amount of F or O radicals as compared with C radicals, the deposition rate has a peak in vicinity of the range of the aspect ratio of 3 to 4. The deposition rate decreases as the aspect ratio becomes higher, but increases again in the aspect ratio range of about 7 to 8.

Instead of using step control on the incident ion energy (FIG. 5B) or applying high frequency power to the bottom electrode 9 step by step (digitally), therefore, ion energy is suppressed low at the beginning of etching and is increased as etching progresses. Then, continuous control to maximize the ion energy in the vicinity of the aspect ratio range of 3 to 4 and then reduce the ion energy again, i.e., linear control of Vpp can more effectively improve the mask selectivity and reduce the damage layer.

In FIG. 5A, the switching time, 150 seconds, is the minimum time needed for etching to progress to the depth of about 2200 nm even when Vpp is reduced to about 1.0 kV from about 1.8 kV. If Vpp is reduced in a shorter switching time, etching does not progress and stops. Whether or not etching progresses is determined by the relationship between the thickness of the deposition film of a fluorocarbon-based composition deposited at the bottom of the hole and the ion energy. When the aspect ratio is smaller than a given value, radicals having a small stacking coefficient are incident to the bottom of the hole, making the deposition film thicker, so that etching stops.

Therefore, the progress of hole etching is observed in real time by using, for example, an interferometer and the ion energy is reduced when the aspect ratio reaches a certain optimal level. Even if the state of the etching apparatus varies slightly, therefore, the problem of etch stop does not occur and stable etching results are acquired. The state of the etching apparatus means the thickness of the deposition film in the vacuum chamber, the state after long usage and a slight difference between apparatuses.

Figure 7:
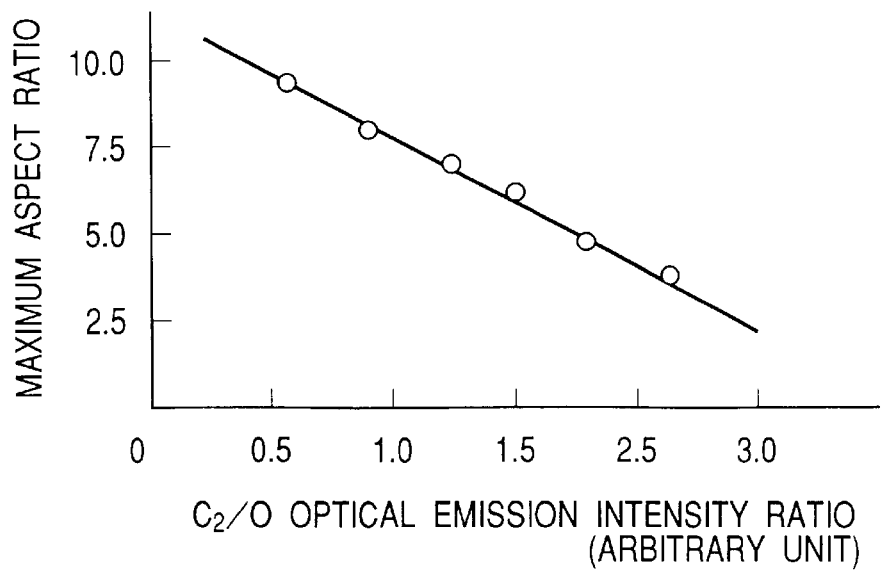
FIG. 7 is a characteristic diagram showing the relationship between the maximum aspect ratio and the optical emission intensity ratio ($C_2$/O) according to the invention.

In case of etching the oxide film, as shown in FIG. 7, the ratio ($C_2$/O) of $C_2$ (ear 516 nm), one type of radicals that contribute to etch stop, to O (near 777 nm), one type of radicals that eliminate the deposition film, is well correlated with the aspect ratio when etch stop occurs. Instead of directly measuring the etching depth with an interferometer, therefore, the $C_2$/O ratio is monitored to control the ion energy or Vpp. Even if the state of the etching apparatus varies slightly, therefore, stable etching results are acquired without causing the problem of etch stop.

The following discusses the case where the contact hole is as shallow as having an aspect ratio of 4 or smaller. In this case, the position of the thick portion of the deposition film in the hole approximately matches with the boundary position between the oxide film and the base film. It is therefore possible to guarantee the progress of etching by employing the ion energy control process shown in FIG. 5A while making the oxygen ($O_2$) flow rate slightly greater than the normal oxygen flow rate, i.e., by while avoiding etch stop during etching of the oxide film.

Referring to FIGS. 3A to 3D and FIGS. 4A to 4D, a scheme of removing the high resistivity layer is described below.

Figure 3B:
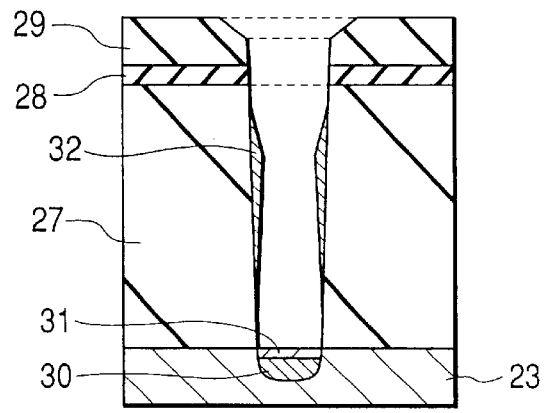

First, as shown in FIG. 3B, a plasma was produced by a mixed gas of Ar, $CF_4$ and $O_2$ after hole etching and removal of the high resistivity layer was performed under a low-bias condition with Vpp being 500 V or lower. The result showed that while the high resistivity layer of several nanometers in thickness was mostly removed, it slightly remained because of C or O contained in the gas.

Figure 4B:
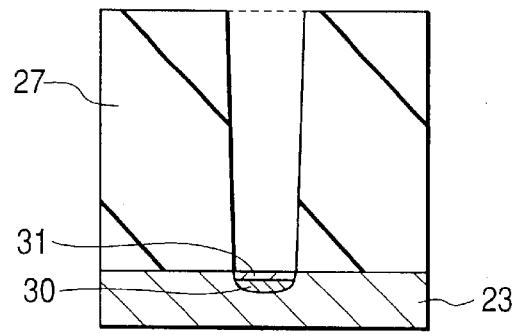

According to the embodiment, therefore, the resist mask, the anti-reflect-coating and the fluorocarbon film are removed, as shown in FIG. 4B, using an ashing step with a gas essentially containing $O_2$.

Figure 4C:
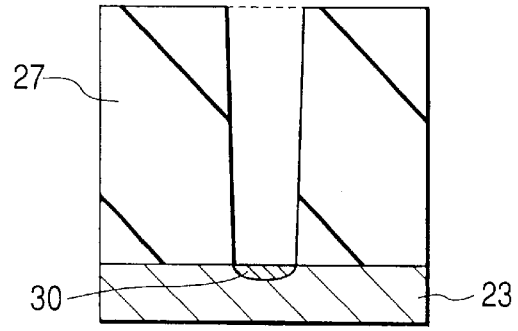

Then, as shown in FIG. 4C, the resultant structure is exposed to a mixed gas plasma of Ar and $H_2$ under a low-bias condition with Vpp being 500 V or lower. For example, a plasma is produced by 450-MHz high frequency power of 800 W with Ar of 100 ml/min and $H_2$ of 200 ml/min at a gas pressure of 4 Pa, and 800-kHz high frequency power of 10 to 300 W (0.014 to 0.42 W/cm$^2$) is applied to the bottom electrode. In this case, the distance from the wafer surface to the antenna surface facing the wafer is 90 mm, and 13.56-MHz high frequency power of 100 W is applied to the antenna. In a particular case where 800-kHz high frequency power of 200 is applied and Vpp is about 350 V, the high resistivity layer is efficiently removed by withdrawal of C or O by the reducing action of hydrogen radicals or etching of the high resistivity layer itself.

The mixed gas of Ar and $H_2$ may be replaced with, for example, a gas consisting of at least one of $NH_3$, $H_2$ and $N_2H_4$, or a mixed gas of at least one of $NH_3$, $H_2$ and $N_2H_4$ and at least one of Ar, He, Xe, Ne and Kr. In particular, setting the mixing ratio of $NH_3$ to 10 to 80% allows C contained in the high resistivity layer to be efficiently dissociated and removed as a volatile gas of CN or CH.

Although the gas pressure is set to 4 Pa in the embodiment, the same advantage can be acquired when the gas pressure ranges from 0.3 to 300 Pa. As those gases do not contain C or O, a high resistivity layer containing SiC or $SiO_x$ will not be formed again on the bottom of the contact hole, thus ensuring efficient cleaning.

Figure 3C:
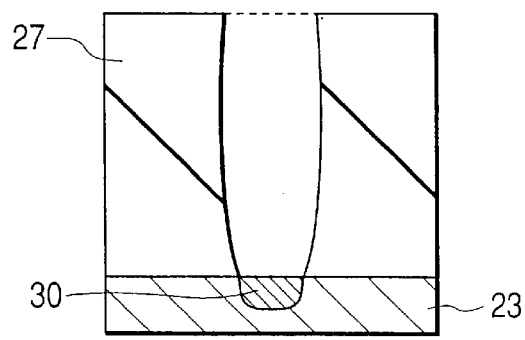

Returning to FIG. 3, one possible way to completely remove the remaining high resistivity layer 31 shown in FIG. 3B is wet cleaning using, for example, a typified HF solution after performing an ashing step essentially with the $O_2$ gas. In this case, isotropic etching tends to progress and the pattern becomes thicker than is designed as shown in FIG. 3C. As the plasma gas contains a large amount of F, the base silicon (30) is etched. In case where a poly-crystalline silicon plug 33 is buried after the contact hole is formed, the enlargement of the pattern size causes a clearance 34 to be formed in the plug 33 as shown in FIG. 3D, causing a burying failure.

According to the embodiment, the above-described etching scheme can completely remove the high resistivity layer in the high-resistivity-layer removing step (see FIG. 4C). This lightens the burden of the wet cleaning after the ashing step, so that isotropic etching can be suppressed. It is therefore possible to suppress widening of the through hole and contribute to miniaturization of semiconductor devices.

As the plasma gas does not contain a large amount of F according to the embodiment, etching of base silicon as shown in FIG. 3C can be avoided.

Figure 3D:
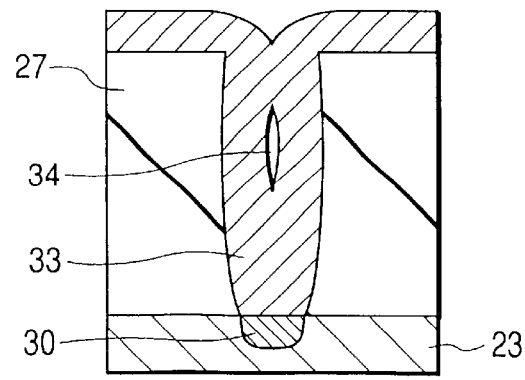
Figure 4D:
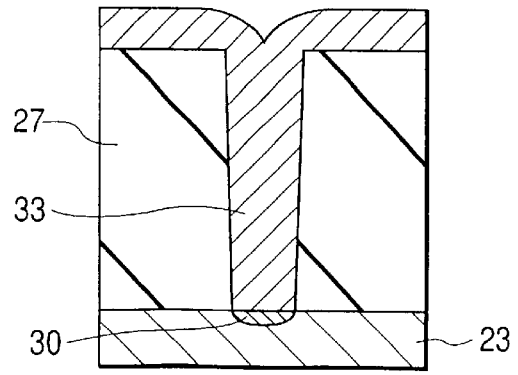

Further, there was an apparent difference in the shape of the poly-crystalline silicon plug 33 as comparatively seen from FIGS. 3D and 4D. That is, when the poly-crystalline silicon plug 33 was buried in the contact hole which had undergone wet cleaning, the enlargement of the pattern size formed the clearance 34 in the plug 33 in some cases, resulting in a burying failure. According to the embodiment, however, the enlargement of the pattern size did not occur and proper burying was carried out as shown in FIG. 4D. In this case, however, while the use of the H-containing gas causes H to penetrate deep in the silicon substrate, this penetration can be avoided by performing annealing at an adequate temperature. The insertion of an annealing step after the high-resistivity-layer removing step prevents the performance of the semiconductor device from being degraded. If an annealing step is provided after the high-resistivity-layer removing step, it is unnecessary to additionally insert an annealing step, so that the removal of the high resistivity layer can be executed without increasing the number of steps.

The embodiment is not limited to the UHF-ECR etching apparatus shown in FIG. 1, but may be adapted to various etching apparatuses, such as an ICP, $\mu$ wave-ECR and a dual frequency parallel plate type, with similar advantages.

(Second Embodiment)

The following discusses an embodiment which controls the amount of radicals in a plasma instead of controlling the ion energy in the contact-hole etching step.

As mentioned earlier, etch stop is determined by the relationship between the thickness of the fluorocarbon film deposited on the bottom of the hole and the ion energy. In case of etching the oxide film with a gas of Ar and $C_5F_8$, dissociation in the plasma mainly produces $CF_2$, F, O and C ("radicals"). Although $CF_3$, CF, $C_2F_4$, C3F7 and so forth are produced besides the four gases, they do not affect the contact-hole etching step significantly and they will not be discussed below.

The relationship among the sticking coefficients S of $CF_2$, F, O and C on the sidewall of the hole is given by the following equation 1.

$$S_C > S_F = S_O > S_{CF2} \quad (1)$$

Figure 8:
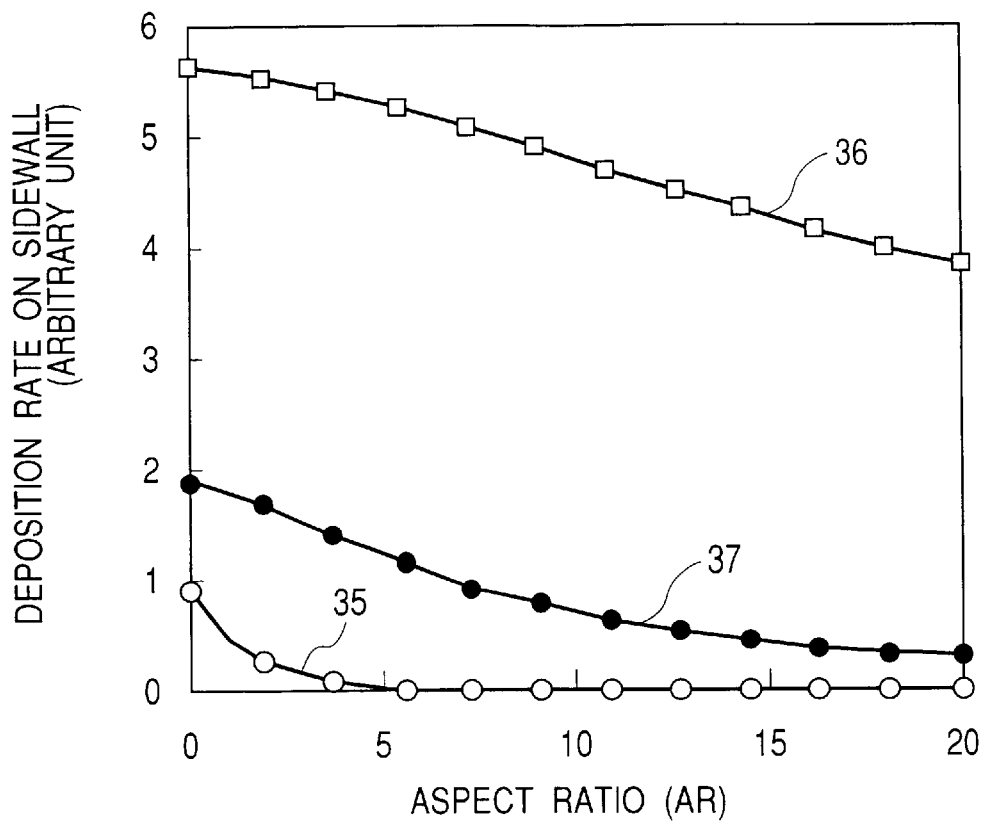
FIG. 8 is a characteristic diagram showing the relationship between the deposition rate on sidewall and the aspect ratio according to the invention.

While the sticking coefficients are used for F and O for the sake of convenience, the sticking coefficients correspond to their probabilities of etching of the deposition film. FIG. 8 presents a conceptual diagram showing the dependency of the deposition rate on sidewall of each radical on the hole aspect ratio in the process with a mixed gas of Ar, $C_5F_8$ and $O_2$ using the sticking coefficients.

In FIG. 8, a curve 35 shows the deposition rate of C (carbon) on sidewall. Because C has a large sticking coefficient, it has a large deposition on the upper portion of the hole and can be a protective film. As the aspect ratio becomes higher, the deposition rate drops rapidly. Because $CF_2$, as indicated by a curve 36, has a small sticking coefficient, it hardly decreases even when the aspect ratio increases. As the sticking coefficients of F (fluorine) and O (oxygen) are between those of C and $CF_2$, the amounts of F and O reaching the bottom of the hole decrease if the hole has a high aspect ratio as indicated by a curve 37.

Figure 9:
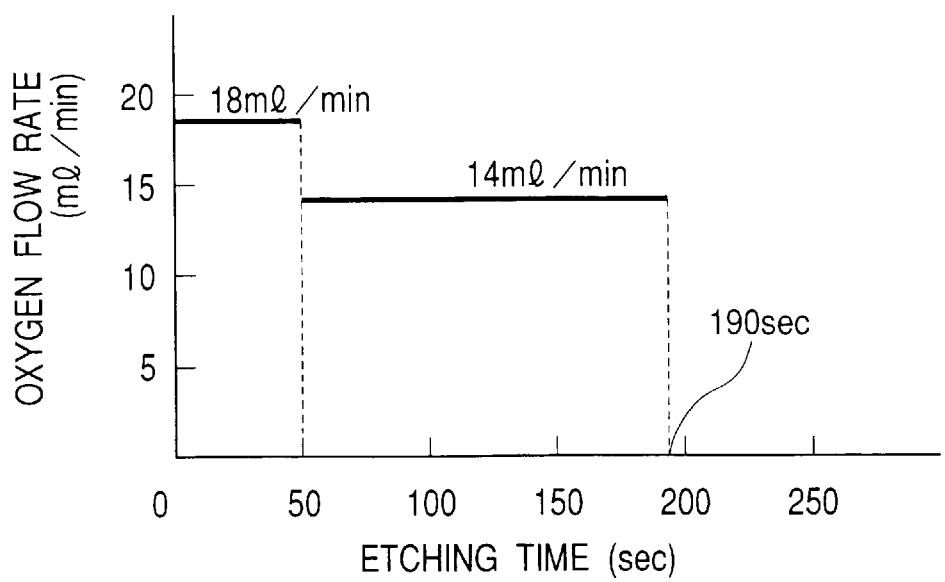
FIG. 9 is a characteristic diagram showing the relationship between the oxygen flow rate and the etching time according to the invention.

Based on the relationship between the deposition rate on sidewall and the aspect ratio shown in FIG. 6, if an oxygen flow rate enough not to cause etch stop is provided from the aspect ratio range of about 3 to 4, etch stop does not occur even if the oxygen flow rate is reduced thereafter. FIG. 9 shows a scheme of controlling the oxygen flow rate according to the embodiment. The oxygen flow rate is set to 18 ml/min at the beginning of etching and is changed to 14 ml/min after 50 seconds at which time the etching depth reaches 600 nm (aspect ratio 5). This control can keep the deposition film at the bottom of the hole thick in the stage where the base silicon layer (region) is exposed, as compared with the process that feeds a constant oxygen flow rate from the beginning of etching to the end thereof. This can relax the bombardment of the ion energy and can reduce the thickness of the damage layer.

Although not illustrated, the control includes continuous control of the oxygen flow rate instead of changing the oxygen flow rate step by step. Similar advantages can be expected by the combination of the ion energy control that has been discussed in the section of the first embodiment and the oxygen flow rate control.

Further, similar advantages are acquired by controlling the amount of F radicals which are consumed on the antenna surface by adjusting 13.56-MHz power to be applied to the antenna as etching progresses.

Furthermore, the etching depth may be measured by a measuring means as done in the first embodiment and the results may be reflected on the oxygen flow rate control.

(Third Embodiment)

Figure 10A:
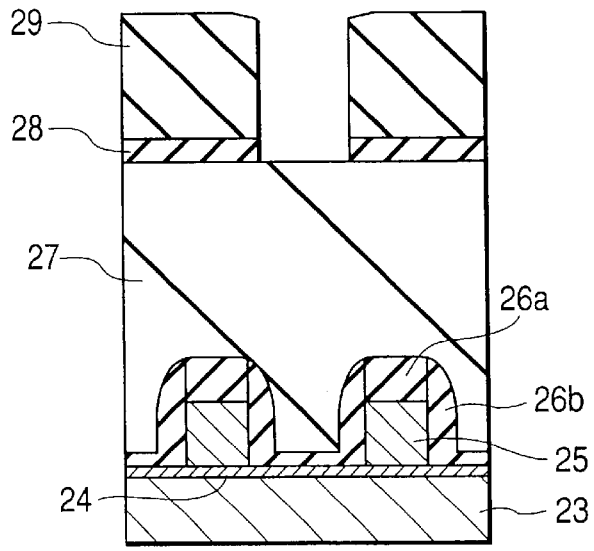
FIGS. 10A through 10C are cross-sectional views of essential portions in the fabrication of a semiconductor device according to a third embodiment of the invention.
Figure 10B:
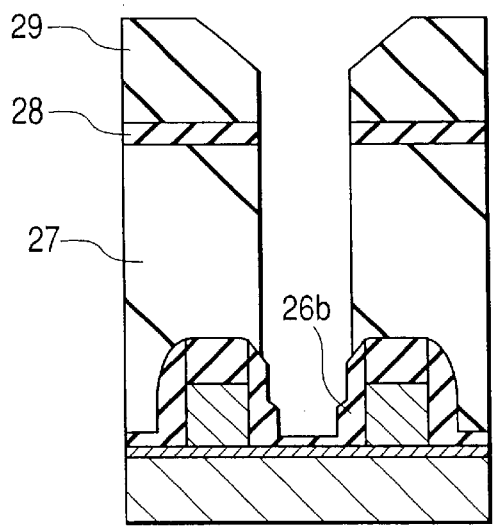
Figure 10C:
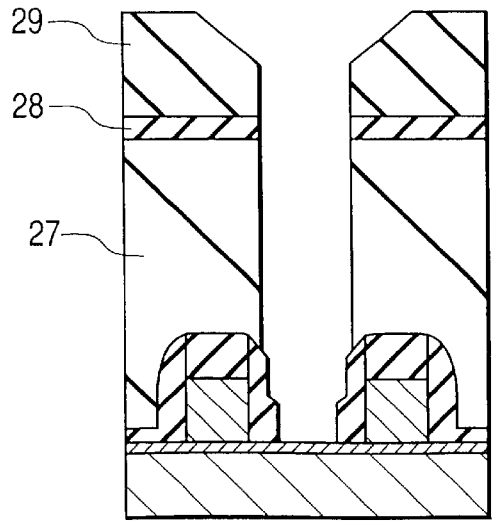

The following discusses the case where the high-resistivity-layer removing step of the invention as described in the section of the first embodiment is adapted to self-align contact hole processing with reference to FIGS. 10A to 10C.

As shown in FIG. 10A, a gate oxide film 24 having a thickness of, for example, 2 nm, is formed on a semiconductor substrate (silicon wafer) 23. Formed on a part of the gate oxide film 24 is a gate electrode 25 which is the lamination of poly-crystalline silicon and tungsten and has a thickness of 200 nm and a width of 100 nm. A cap layer 26 of silicon nitride is formed on the peripheral portion of the gate electrode 25. Formed on the upper portion of the cap layer 26 are an oxide film 27 of 500 nm in thickness, an anti-reflect-coating 28 of 80 nm in thickness and a resist mask 29 of 500 nm in thickness which has a hole pattern of 200 nm in diameter formed thereon. The anti-reflect-coating 28 has already been selectively etched by a mixed gas of $N_2$ and $CF_4$. Though not illustrated, a source-drain region is formed in the semiconductor substrate 23.

Next, the oxide film 27 is etched as shown in FIG. 10B. The silicon wafer 23 is placed on the chuck section 20 of the etching apparatus shown in FIG. 1. Then, Ar, $C_5F_8$ and $O_2$ are fed into the vacuum chamber 1 at rates of, for example, 1000 ml/min, 15 ml/min and 21 ml/min, respectively, and the pressure in the vacuum chamber 1 is adjusted by the conductance valve in such a way that the pressure becomes 15 mTorr. A plasma is produced with 450-MHz high frequency power of 400 W and 800-kHz high frequency power of 1300 W (1.84 W/cm$^2$) is applied to the bottom electrode for plasma etching of the oxide film 27. In this case, the intended ion energy Vpp is about 1.3 kV. The height of the bottom electrode is adjusted in such a way that the distance from the wafer surface to the antenna surface facing the wafer becomes 50 mm, and 13.56-MHz high frequency power of 200 W is applied to the antenna. The process conditions ensure that the selectivity of the oxide film with respect to the silicon nitride film is as high as about 30 even at the shoulder portions and etching ends with a sufficient base silicon nitride film left as shown in FIG. 10B.

Next, the base silicon nitride film 26 is etched as shown in FIG. 10C. The etching conditions are such that Ar, $CHF_3$ and $O_2$ are fed into the vacuum chamber 1 at rates of, for example, 200 ml/min, 30 ml/min and 20 ml/min, respectively, and the pressure in the vacuum chamber 1 is set to 30 mTorr. A plasma is produced to etch the silicon nitride film by adjusting the height of the bottom electrode in such a way that the distance from the wafer surface to the antenna surface facing the wafer becomes 90 mm, and applying 13.56-MHz high frequency power of 200 W to the antenna and 800-kHz high frequency power of 400 W (0.57 W/cm$^2$) to the bottom electrode. In this case, because the selectivity of the silicon nitride film 26b with respect to the oxide film and the gate oxide film 24 remains, the etching conditions are changed again to those for the case of FIG. 10B and the gate oxide film is etched. The conditions ensure a high selectivity with silicon so that source-drain region (active region) formed in the semiconductor substrate 23 will not be etched. When the gate oxide film 24 is very thin or has already been removed, the gate-oxide-film etching step may not be needed in some cases.

Subsequently, the high-resistivity-layer removing step that has been discussed in the section of the first embodiment is performed. Under the nitride-film etching conditions or gate-oxide-film etching conditions of the embodiment, the ion energy is lower than that in the gate-oxide-film etching conditions of the first embodiment. Therefore, the damage layer and the oxide suppressing layer or the high resistivity layer that are formed on the base silicon substrate by etching are thin, thus making it possible to sufficiently suppress the contact resistance in the high-resistivity-layer removing step.

(Fourth Embodiment)

Figure 11:
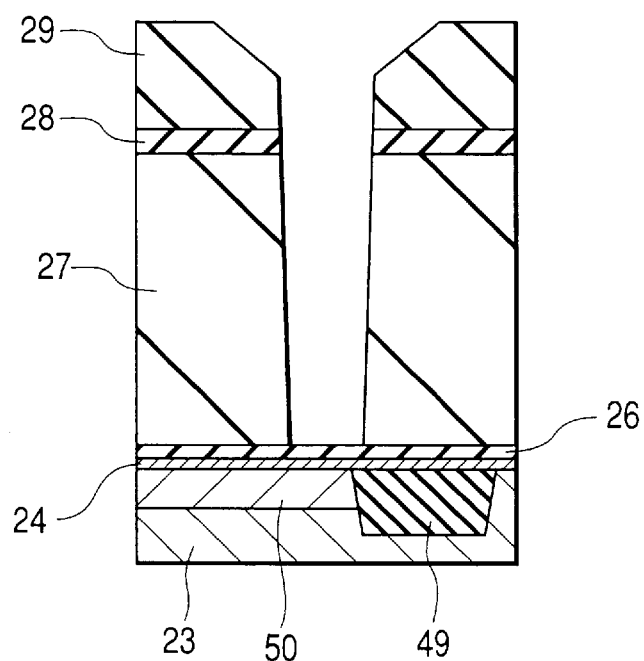
FIG. 11 is a cross-sectional views of essential portions in the fabrication of a semiconductor device according to a fourth embodiment of the invention.
Figure 15:
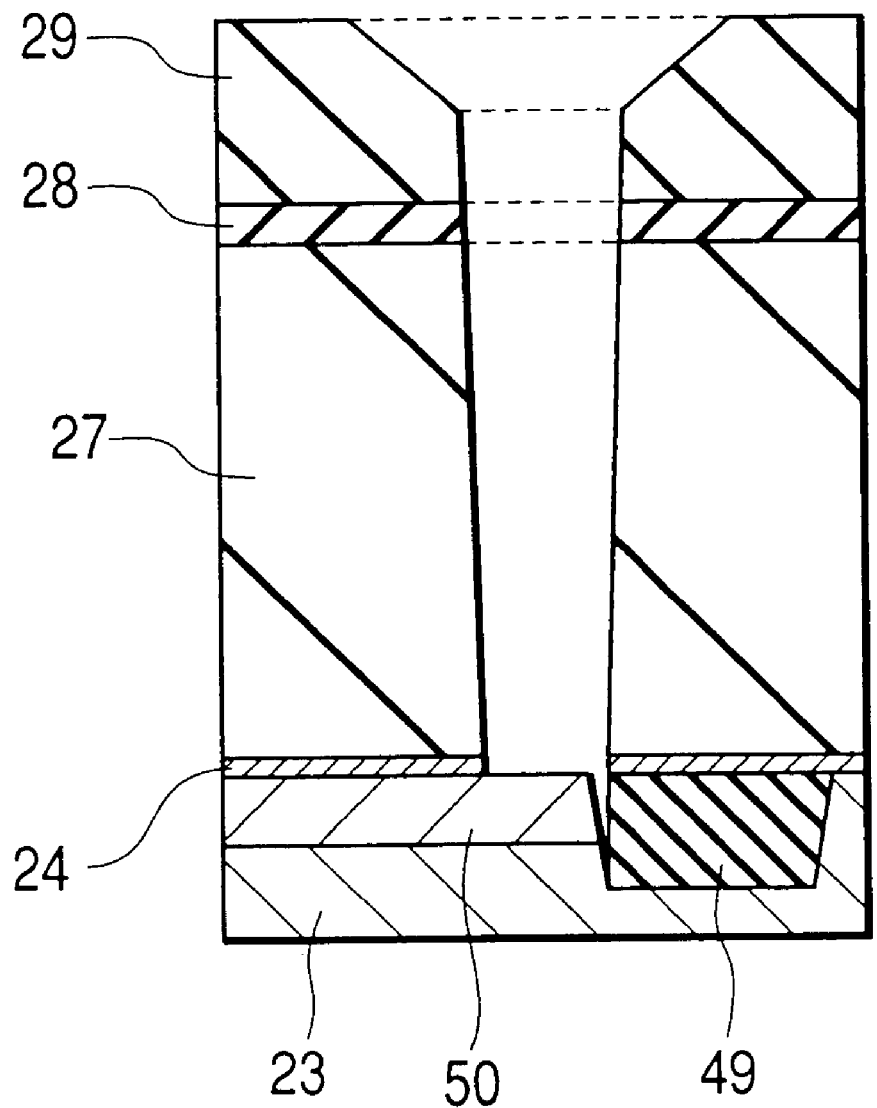
FIG. 15 is a cross-sectional view of essential portions in the fabrication of a semiconductor device that the present inventors studied before the fourth embodiment of the invention.

Referring to FIGS. 11 and 15, the following discusses the case where a contact hole is formed near STI (Shallow Trench Isolation) which is shallow device isolation.

When the contact hole lies over an STI 49 due to mask misalignment in the lithography process, as shown in FIG. 15, etching progresses through the STI 49 at the time of overetching the oxide film 27 and the gate oxide film 24. This may expose the base silicon 23 through a source-drain region (active region) 50. As a result, the conductor layer (metal or poly-crystalline silicon) buried in the contact hole short-circuits the PN junction between the source-drain region 50 and the base silicon 23. This produces a current leak, which leads to refresh failure in case of a memory (DRAM) or the like.

To prevent the shortcoming, the silicon nitride film 26 is formed on the gate oxide film 24 as a stopper film that can guarantee the selectivity with respect to the oxide film, as shown in FIG. 11. According to the process of the third embodiment, etching through the STI 49 can be avoided. This overcomes the problem of the leak current.

(Fifth Embodiment)

Figure 12:
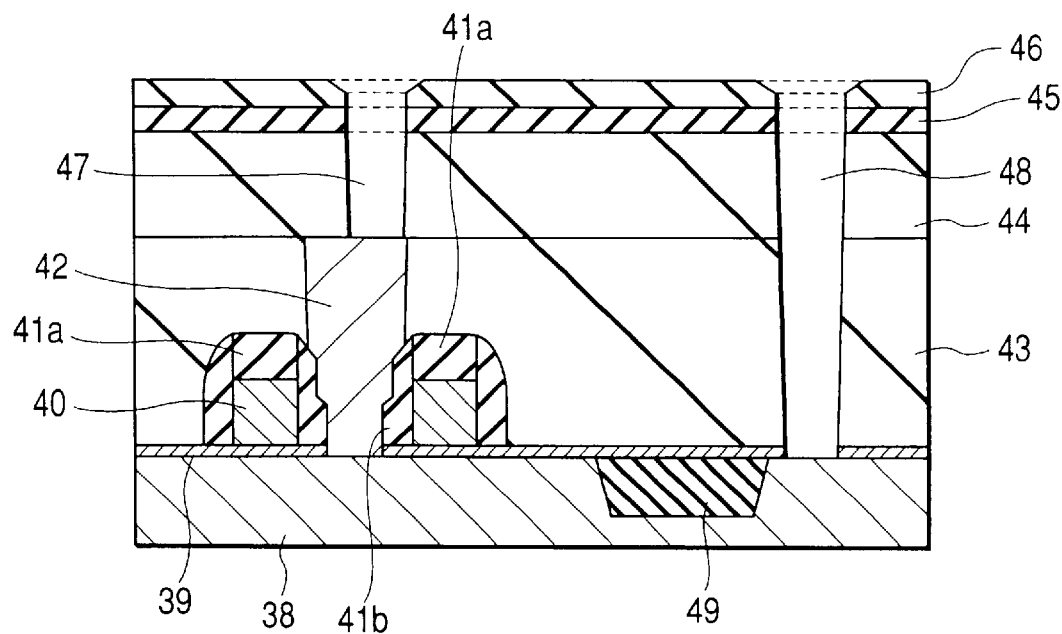
FIG. 12 is a cross-sectional view of essential portions in the fabrication of a semiconductor device according to a fifth embodiment of the invention.

Referring to FIG. 12, the following discusses an example of adaptation of the contact-hole etching step by the ion energy control and radical quantity control.

FIG. 12 is a cross-sectional view of a fabrication process of a semiconductor device, and particularly shows a bi-level sample (a sample whose contact holes of different depths are etched at a time). In FIG. 12, the source-drain region (active region) in a silicon wafer 38 is omitted.

As shown in FIG. 12, a gate oxide film 39 having a thickness of, for example, 2 nm, is formed on the silicon wafer 38, and a gate electrode 40 which is the lamination of poly-crystalline silicon and tungsten and has a thickness of 200 nm and a width of 100 nm is formed on a part of the gate oxide film 39. A cap layer 41a of silicon nitride and sidewalls 41b are formed on the peripheral portion of the gate electrode 40. An oxide film 43 of 500 nm in thickness is formed on the gate electrode 40 and the gate oxide film 39. A contact hole is formed in the oxide film 43 by the self-align contact (SAC) technique. That is, the contact hole is formed by etching under the condition that the selectivity of the oxide film 43 with respect to the silicon nitride film (41b) is high. A plug 42 of poly-crystalline silicon is formed in the contact hole.

Formed on the upper portion of the oxide film 43 where the plug 42 is formed are an oxide film 44 of 200 nm in thickness, an anti-reflect-coating 45 of 80 nm in thickness and a resist mask 46 of 500 nm in thickness which has a hole pattern of 200 nm in diameter formed thereon. The anti-reflect-coating 45 has already been etched by a mixed gas of $N_2$ and $CF_4$. In this case, a contact hole (through hole) 47 provides contact to the plug 42 of poly-crystalline silicon and has an etching depth of 200 nm, whereas a contact hole 48 provides contact to the base silicon substrate and has an etching depth of 700 nm.

In case of etching such holes having different etching depths at a time, etching had been performed with constant ion energy and a constant oxygen flow rate. Poly-crystalline silicon or the like that is the base film of the shallow contact hole was etched before etching of the deep contact hole was finished, thus resulting in a low selectivity.

According to the embodiment, to etch the bi-level sample, control of reducing the ion energy as shown in FIG. 5A and control of reducing the oxygen flow rate as shown in FIG. 9 are executed as the etching depth becomes greater.

Therefore, the embodiment can achieve not only an improvement of the selectivity of the base film and damage reduction in the deep contact hole 48 but also an improvement of the selectivity of the base film and damage reduction in the shallow contact hole 47.

As the high-resistivity-layer removing step using a reducing gas that has been discussed in the section of the first embodiment is used for this sample, it is possible to construct a process which can efficiently remove the high resistivity layer and eliminate the wet cleaning step or reduce the burden thereof.

(Sixth Embodiment)

The following discusses an embodiment which is a module of an semiconductor processing apparatus that is needed in the contact-hole etching step, ashing step and high-resistivity-layer removing step.

Figure 13:
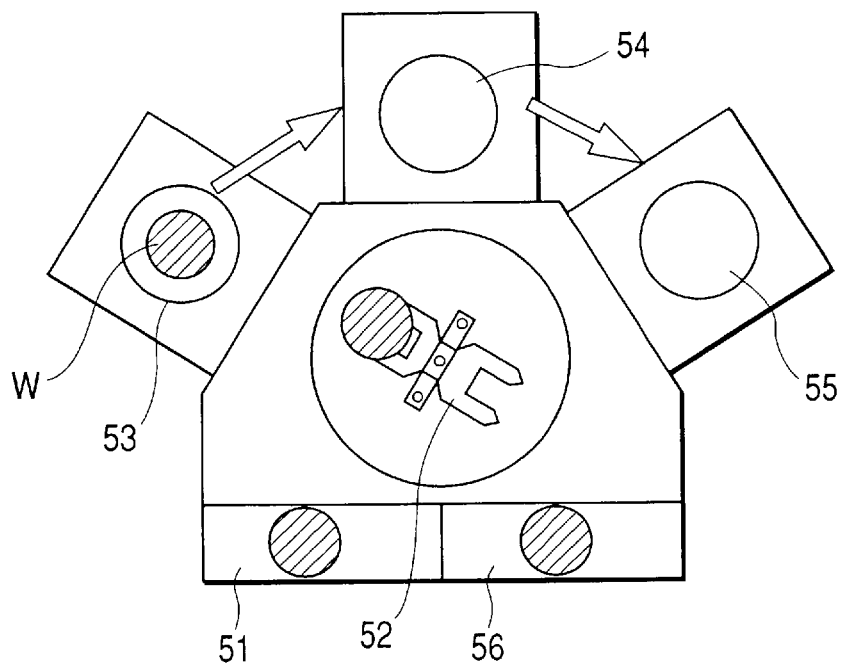
FIG. 13 is a plan view showing a multichamber type semiconductor processing system according to a sixth embodiment of the invention.

FIG. 13 illustrates a multichamber type semiconductor processing system according to the embodiment. This semiconductor processing system comprises a load lock chamber 51, a wafer transfer robot (transfer chamber) 52, an etching chamber 53, an ashing chamber 54, a high-resistivity-layer removing chamber 55 and an unload lock chamber 56. As apparent from the diagram, the etching chamber 53, ashing chamber 54 and high-resistivity-layer removing chamber 55 are arranged around the wafer transfer robot 52.

The following describes a contact-hole etching process using the semiconductor processing system.

As shown in FIG. 13, a wafer W loaded from the load lock chamber 51 is placed into the etching chamber 53 by the wafer transfer robot 52. The wafer W is processed in the etching chamber 53 by the contact-hole etching process that has been explained in the section of the first embodiment or the section of the second embodiment.

Subsequently, the wafer W is supplied into the ashing chamber 54 where the resist mask and the fluorocarbon film deposited in the contact hole are removed.

Next, the wafer W is carried into the high-resistivity-layer removing chamber 55 where the high resistivity layer at the bottom of the contact hole is removed by the scheme that has been explained in the section of the first embodiment.

Then, the wafer W is removed from the unload lock chamber 56. In the embodiment, etching, ashing and high-resistivity-layer removal are executed in the named order. But, the locations of the ashing chamber and the high-resistivity-layer removing chamber may be reversed, or the process may be carried out in the order of etching, high-resistivity-layer removal and ashing.

(Seventh Embodiment)

The seventh embodiment provides a multichamber type semiconductor processing system which has a dry cleaning chamber in addition to the components of the sixth embodiment.

Figure 14:
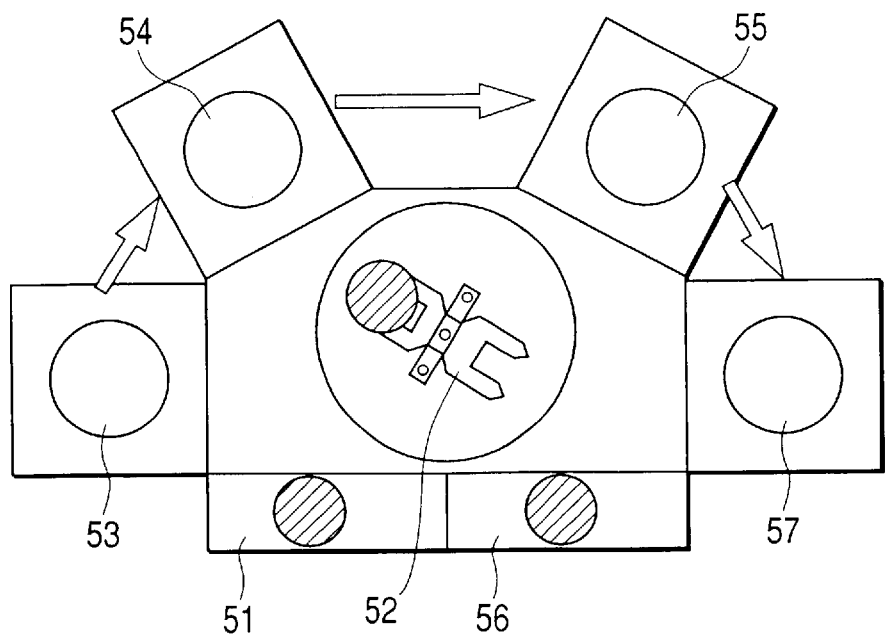
FIG. 14 is a plan view showing a multichamber type semiconductor processing system according to a seventh embodiment of the invention.

As shown in FIG. 14, a dry cleaning chamber 57 is located at the subsequent stage of the high-resistivity-layer removing chamber 55. One example of dry cleaning of a wafer in the dry cleaning chamber 57 is the technique disclosed in the specification of Japanese Patent Application No. 2001-007158 filed on Jan. 16, 2001 by the present inventors. Specifically, a foreign matter sticking on the major surface of the wafer is removed by applying a fast gas stream to the major surface while keeping the interior of the dry cleaning chamber 57 at a reduced pressure. At this time, an inactive gas such as an Ar gas is used.

According to the embodiment, a sequence of hole etching to cleaning can be performed by the dry through process, thus improving the throughput.

Although the embodiments of the invention done by the present inventors have been described specifically, the invention is not limited to those embodiments but may be modified in various other forms without departing the scope of the subject matters of the invention.

The following describes several embodiments of the invention.

(1) One of the embodiments of the invention is a process for fabricating a semiconductor device using a semiconductor processing equipment having a vacuum chamber to be vacuum-pumped by vacuum pump means, gas feeding means for feeding a source gas into the vacuum chamber, means for holding a specimen to be treated and means for supplying high frequency power, which process comprises the steps of:

placing a semiconductor substrate having an insulating film on a major surface on the means for holding the specimen to be treated;

transforming the gas, fed into the vacuum chamber by the gas feeding means, into a plasma and selectively etching the insulating film with the plasma, thereby forming a contact hole in the insulating film;

then cleaning or processing the semiconductor substrate having the contact hole formed therein by applying a high frequency bias to the semiconductor substrate and using a reducing gas.

According to the embodiment, as a semiconductor substrate which has a contact hole formed therein is cleaned or processed using a reducing gas, C or O is withdrawn from a high resistivity layer formed in the base layer at the time of forming the contact hole, e.g., a high resistivity layer containing SiC or $SiO_x$ in the case of a silicon substrate, or the high resistivity layer itself is removed, thereby suppressing an increase in contact resistance. Further, executing the process using the same apparatus can lead to an improvement of the throughput and reduction in the number of constituting apparatuses.

(2) Another embodiment of the invention is a process for fabricating a semiconductor device using a semiconductor processing equipment having a vacuum chamber to be vacuum-pumped by vacuum pump means, gas feeding means for feeding a source gas into the vacuum chamber, means for holding a specimen to be treated and means for supplying high frequency power, which process comprises the steps of:

placing a semiconductor substrate having an insulating film on a major surface on the means for holding the specimen to be treated; and transforming the gas, fed into the vacuum chamber by the gas feeding means, into a plasma and selectively etching the insulating film with the plasma, thereby forming a contact hole in the insulating film which reduces ion energy during etching.

The ion energy is reduced when the thickness of a deposition film present on a bottom portion of the contact hole becomes thinner than 1/3 of an entering distance of the ion energy at a time of etching.

According to the embodiment, etching does not stop even if the ion energy is reduced when the thickness of the deposition film present on the bottom portion of the contact hole becomes thinner than 1/3 of the penetration distance of the ion energy. It is therefore possible to reduce damages on the surface of the active region and, at the same time, improve the selectivity of the shoulder portions of the mask which are controlled by the ion energy.

(3) A further embodiment of the invention is the process in paragraph (2) wherein the ion energy is reduced when the etching depth of the insulating film becomes 600 nm or greater.

According to the embodiment, at the etching depth deeper than 600 nm, the thickness of the deposition film that is deposited on the bottom of the hole becomes sufficiently thinner than the penetration depth of the ion energy, so that etch stop does not occur even when the ion energy is reduced. This makes it possible to reduce damages on the base layer and, at the same time, improve the selectivity of the shoulder portions of the mask which are controlled by the ion energy.

(4) A different embodiment of the invention is the process in paragraph (1) wherein an ashing step of performing ashing with a gas mainly containing oxygen and a step of cleaning or processing the insulating film by using a reducing gas are included following the step of selectively etching the insulating film.

According to the embodiment, as a cleaning step or a processing step using a reducing gas is inserted after ashing, the formation of an oxide film by the oxidation of the base film can be suppressed, thus reducing the contact resistance.

(5) A further embodiment of the invention is the process in paragraph (1) wherein in a period of forming a through hole in the insulating film by selective etching, ion energy incident to the insulating film is adjusted by changing high frequency bias power to be applied to the semiconductor substrate with passage of a processing time.

According to the embodiment, controlling the ion energy in accordance with the progress of etching can reduce damages on the silicon substrate and interconnection layer that lie under the contact hole and are bombarded with ions at the time of overetching.

(6) A still further embodiment of the invention is the process in paragraph (1) wherein at a time of selectively etching the insulating film, an amount of radicals in the plasma is adjusted with passage of a processing time.

According to the embodiment, as the aspect ratio becomes higher with the progress of etching, the thickness of the deposition film deposited on the bottom of the hole decreases. At this time, reducing the amount of radicals, such as O or F radicals, in synchronism with the film thickness can keep the thickness of the deposition film deposited on the bottom of the hole constant and buffer the ion energy that is bombarded on the silicon substrate and interconnection layer that lie under the contact hole. This can suppress the formation of the damage layer.

(7) A yet still further embodiment of the invention is the process in paragraph (1) wherein the means for supplying high frequency power is an electrode or an antenna, means for applying second high frequency bias power to the electrode or the antenna is provided, and an amount of radicals in the plasma is adjusted by changing the second high frequency bias power with passage of a processing time at a time of selectively etching the specimen to be treated.

According to the embodiment, the thickness of the deposition film deposited on the bottom of the hole can be controlled by controlling the amount of radicals, such as O or F radicals, accurately and in a short response time by the application of the second high frequency bias power to the electrode or the antenna, and the formation of the damage layer can be suppressed by buffering the ion energy that is bombarded on the silicon substrate and interconnection layer that lie under the contact hole. Further, as O or F is an etchant for the mask material, such as photo-resist or polycrystalline silicon, the embodiment also demonstrates an effect of improving the selectivity of a specimen to be treated.

(8) A still further embodiment of the invention is the process in paragraph (1) wherein the high frequency power has a frequency of 10 MHz to 900 MHz.

According to the embodiment, setting the frequency of high frequency power that produces a plasma in a range of 10 MHz to 900 MHz can reduce the temperature of the electrons in the plasma and suppress the amount of radicals, such as O or F radicals, that are dissociated in the plasma. This can widen the control range of the radical quantity.

The following is the brief description of the advantages of the typified one of the subject matters disclosed in this specification.

According to the invention, the formation of a damage layer and high resistivity layer in the contact hole can be suppressed or removed efficiently, which contributes to an improvement of the production yield of semiconductor devices. Because wet processing may not be needed in the removal of the high resistivity layer, isotropic etching can be suppressed and etching of contact holes with narrow pattern pitches can be achieved. This can ensure miniaturization of a semiconductor device.

What is claimed is:

1. A method for fabricating a semiconductor device, comprising the steps of:
   (a) forming a plurality of contact holes in an insulating film formed on a major surface of a semiconductor substrate by dry etching;
   (b) cleaning inside said contact holes by applying high frequency power to said semiconductor substrate and using a reducing gas consists of at least one of $NH_3$, $H_2$ and $N_2H_4$, or a gas mixture of at least one of $NH_3$ and $N_2H_4$ and at least one of Ar, He, Xe, Ne and Kr; and
   (c) burying a semiconductor or conductor in said contact holes in said insulating film.

2. The method for fabricating a semiconductor device according to claim 1, wherein said contact hole is cleaned or processed by using a gas mixture containing $NH_3$ whose mixing ratio ranges from 10% to 80%.

3. The method for fabricating a semiconductor device according to claim 1, wherein said insulating film comprises an oxide film.

4. A method for fabricating a semiconductor device, comprising the steps of:
   forming an interlayer insulating film on a substrate having a semiconductor layer or a conductor layer on a major surface;
   forming on said interlayer insulating film a mask having an opening located above aid semiconductor layer or said conductor layer;
   selectively etching aid interlayer insulating film through said opening of said mask in an environment in which a gas containing a fluorocarbon gas and oxygen gas is excited in a plasma state, thereby forming an opening in said interlayer insulating film through which a surface of said semiconductor layer or said conductor layer is exposed;
   processing said surface of said semiconductor layer or said conductor layer exposed through said opening of said interlayer insulating film by applying said substrate with a bias for accelerating ions in an environment of a reducing gas being excited in a plasma state; and
   burying a semiconductor or conductor in said opening of said interlayer insulating film.

5. The method for fabricating a semiconductor device according to claim 4, wherein said reducing gas consists of at least one of $NH_3$, $H_2$ and $N_2H_4$, or a gas mixture of at least one of $NH_3$, $H_2$ and $N_2H_4$ and at least one of Ar, H , Xe, Ne and Kr.

6. A method for fabricating a semiconductor device using semiconductor processing equipment having a vacuum chamber arranged to be vacuum-pumped by vacuum pump means, gas feeding means for feeding a source gas into said vacuum chamber, means for holding a specimen to be treated and means for supplying high frequency power, comprising the steps of:
   placing a semiconductor substrate having an insulating film on a major surface n said means for holding said specimen to be treated; and
   transforming said gas, fed into said vacuum chamber by said gas feeding means, into a plasma and selectively etching said insulating film wit said plasma, thereby forming a contact hole in said insulating film, while reducing ion energy during etching.

7. The method for fabricating a semiconductor device according to claim 6, wherein said ion energy is reduced when a thickness of a deposition film present on a bottom portion of said contact hole becomes thinner than $\frac{1}{3}$ of an entering distance of said ion energy at a time of etching.

8. The method for fabricating a semiconductor device according to claim 6, wherein said ion energy is reduced when an etching depth of said insulating film becomes 600 nm or greater.

9. The method for fabricating a semiconductor device according to claim 6, wherein an ashing step of performing ashing with a gas mainly containing oxygen and a step of cleaning or processing said insulating film by using a reducing gas are included following said step of selectively etching said insulating film.

10. The method for fabricating a semiconductor device according to claim 6, wherein in a period of forming a through hole in said insulating film by selective etching, ion energy incident to said insulating film is adjusted by changing high frequency bias power to be applied to said semiconductor substrate with passage of a processing time.

11. The method for fabricating a semiconductor device according to claim 6, wherein at a time of selectively etching said insulating film, an amount of radicals in said plasma is adjusted with passage of a processing time.

12. The method for fabricating a semiconductor device according to claim 6, wherein said means for supplying high frequency power is an electrode or an antenna, means for applying second high frequency bias power to said electrode or said antenna is provided, and an amount of radicals in said plasma is adjusted by changing said second high frequency bias power with passage of a processing time at a time of selectively etching said specimen to be treated.

13. The method for fabricating a semiconductor device according to claim 6, wherein said high frequency power has a frequency of 10 MHz to 900 MHz.

14. A method for fabricating a semiconductor device comprising the steps of:
   forming a contact hole in an insulating film formed on a major surface of a semiconductor substrate using a mask by dry etching;
   of removing said mask by ashing using an oxygen gas; and
   removing a high resistivity layer exposed at a bottom portion of aid contact hole by applying high frequency power to said semiconductor substrate and using a reducing gas consists of at least one of $NH_3$, $H_2$ and $N_2H_4$, or a gas mixture of at leas one of $NH_3$ and $N_2H_4$ and at least one of Ar, He, Xe, Ne and Kr.

* * * * *